(12) United States Patent
Shu et al.

(10) Patent No.: US 9,275,898 B1
(45) Date of Patent: Mar. 1, 2016

(54) METHOD TO IMPROVE SELECTIVITY COBALT CAP PROCESS

(71) Applicant: GLOBALFOUNDRIES Inc., Grand Cayman (KY)

(72) Inventors: Jiehui Shu, Clifton Park, NY (US); Zhiguo Sun, Halfmoon, NY (US); Yang Bum Lee, Watervliet, NY (US); Huang Liu, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/637,442

(22) Filed: Mar. 4, 2015

(51) Int. Cl.
*H01L 21/768* (2006.01)
*H01L 23/522* (2006.01)
*H01L 23/532* (2006.01)

(52) U.S. Cl.
CPC .... *H01L 21/76834* (2013.01); *H01L 21/76883* (2013.01); *H01L 23/5226* (2013.01); *H01L 23/53228* (2013.01); *H01L 23/53238* (2013.01)

(58) Field of Classification Search
CPC ................................. H01L 23/53204
See application file for complete search history.

(56) References Cited

U.S. PATENT DOCUMENTS

2015/0221542 A1* 8/2015 Knisley ............... H01L 21/7685
438/653

* cited by examiner

*Primary Examiner* — Cheung Lee
(74) *Attorney, Agent, or Firm* — Ditthavong & Steiner, P.C.

(57) ABSTRACT

Methods of forming a Co cap on a Cu interconnect in or through an ULK ILD with improved selectivity while protecting an ULK ILD surface are provided. Embodiments include providing a Cu filled via in an ULK ILD; depositing a Co precursor and $H_2$ over the Cu-filled via and the ULK ILD, the Co precursor and $H_2$ forming a Co cap over the Cu-filled via; depositing an UV cured methyl over the Co cap and the ULK ILD; performing an $NH_3$ plasma treatment after depositing the UV cured methyl; and repeating the steps of depositing a Co precursor through performing an $NH_3$ plasma treatment to remove impurities from the Co cap.

20 Claims, 4 Drawing Sheets

METHOD TO IMPROVE SELECTIVITY COBALT CAP PROCESS

TECHNICAL FIELD

The present disclosure relates to the manufacture of semiconductor devices with copper (Cu) vias or interconnects. The present disclosure is particularly applicable to cobalt (Co) capped interconnects or vias through ultra low-k (ULK) interlayer dielectrics (ILDs).

BACKGROUND

To provide electrical conductivity between layers in a semiconductor device, an interconnect or via may be formed through an ILD. The via is then lined with a barrier and filled with an electrically conductive material such as Cu to provide electrical conductivity between the layers. As semiconductor components continue to be scaled down and placed closer together, ILDs have become thinner, requiring lower-k dielectric materials, e.g. ULK dielectrics, to be used for improved electrical performance. For electromagnetic (EM) improvement, a Co cap is formed over a Cu via, e.g. by selectively depositing Co on top of the Cu. Selectivity is determined by the amount of Co thickness on top of the Cu divided by the amount of Co thickness on top of the ULK ILD. As Co is deposited on Cu, carbon (C) remains on the surface, which reduces the deposition rate over time. Moreover, too much Co deposited on the ULK ILD surface will cause time-dependent dielectric breakdown (TDDB) failure. Consequently, ammonia ($NH_3$) plasma is used to recover the deposition rate by removing impurities, e.g., C ring groups, from the Co surface. However, with each $NH_3$ plasma treatment, selectivity is reduced between the Cu and ULK ILD surfaces, and damage to the ULK is increased.

A need therefore exists for methodology enabling selective Co capping of a Cu interconnect while protecting the ULK ILD surface.

SUMMARY

An aspect of the present disclosure is a method of forming a Co cap with improved selectivity and ULK surface protection by depositing an ultraviolet (UV) cured methyl prior to performing a $NH_3$ plasma treatment.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a Cu filled via in an ULK ILD; depositing a Co precursor and hydrogen ($H_2$) over the Cu-filled via and the ULK ILD, the Co precursor and $H_2$ forming a Co cap over the Cu-filled via; depositing an UV cured methyl over the Co cap and the ULK ILD; performing an $NH_3$ plasma treatment after depositing the UV cured methyl; and repeating the steps of depositing a Co precursor through performing an $NH_3$ plasma treatment to remove impurities from the Co cap.

Aspects of the present disclosure include depositing cyclopentadienylcobalt dicarbonyl ($Co(C_5H_5)(Co)_2$) as the Co precursor. Other aspects include depositing the Co precursor by thermal chemical vapor deposition (CVD). Further aspects include depositing trimethylsilane (TMS) as the UV cured methyl. Another aspect includes depositing tetramethylsilane (4MS) as the UV cured methyl. Additional aspects include depositing the UV cured TMS or 4MS at a temperature of 200° C. to 400° C. Other aspects include depositing the UV cured TMS or 4MS at the temperature for 30 second (sec) to 90 sec. Further aspects include depositing the UV cured TMS or 4MS at a pressure 20 torr to 40 torr. Another aspect includes repeating the steps of depositing a Co precursor through performing an $NH_3$ plasma treatment two (2) times.

Another aspect of the present disclosure is a method including: providing a Cu filled via in an ULK ILD; depositing $Co(C_5H_5)(Co)_2$ and $H_2$ over the Cu-filled via and the ULK ILD, the $Co(C_5H_5)(Co)_2$ and $H_2$ forming a Co cap over the Cu-filled via; depositing UV TMS or 4MS over the Co cap and the ULK ILD; performing an $NH_3$ plasma treatment after depositing the TMS or 4MS; and repeating the steps of depositing $Co(C_5H_5)(Co)_2$ through performing an $NH_3$ plasma treatment to remove impurities from the Co cap.

Aspects of the present disclosure include depositing the $Co(C_5H_5)(Co)_2$ by thermal CVD. Other aspects include depositing the UV cured TMS or 4MS at a temperature of 200° C. to 400° C. Further aspects include depositing the UV cured TMS or 4MS at the temperature for 30 sec to 90 sec. Another aspect includes depositing the UV cured TMS or 4MS at a pressure 20 torr to 40 torr. Additional aspects include repeating the depositing through performing steps two (2) times.

A further aspect of the present disclosure is a method including: providing a Cu filled via in an ULK oxide interlayer dielectric ILD; and forming a Co cap on the Cu filled via with a selectivity greater than 200 with respect to the ULK ILD by: depositing $Co(C_5H_5)(Co)_2$ and $H_2$ over the Cu-filled via and the ULK oxide ILD, forming a Co cap; depositing UV cured TMS or 4MS over the Co cap and the ULK oxide ILD; performing an $NH_3$ plasma treatment after depositing the TMS or 4MS; and repeating the depositing through performing steps two (2) times.

Aspects of the present disclosure include depositing the $Co(C_5H_5)(Co)_2$ by thermal CVD. Other aspects include depositing the UV cured TMS or 4MS at a temperature of 200° C. to 400° C. Further aspects include depositing the UV cured TMS or 4MS at the temperature for 30 sec to 90 sec. Another aspect includes depositing the UV cured TMS or 4MS at a pressure 20 torr to 40 torr.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reduced selectivity, reduced Co deposition rate over time, and damage to the ULK ILD attendant upon forming a Co cap on a Cu interconnect through an ULK ILD. With a deposition of UV cured methyl prior to performing a $NH_3$ plasma treatment, the ULK surface is protected during the plasma treatment and selectivity is increased.

Methodology in accordance with embodiments of the present disclosure includes providing a Cu filled via in an ULK ILD. A Co precursor and $H_2$ are deposited over the Cu-filled via and the ULK ILD. A Co cap is formed over the Cu-filled via by the deposition of the Co precursor and $H_2$. A UV cured methyl is deposited over the Co cap and the ULK ILD. A $NH_3$ plasma treatment is performed after the UV cured methyl is deposited, and the steps of depositing a Co precursor through performing an $NH_3$ plasma treatment are repeated to remove impurities from the Co cap.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
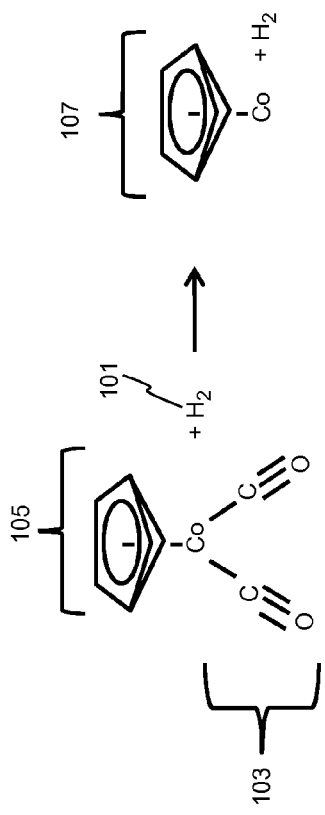
FIGS. 1A through 1E schematically illustrate sequential steps of a background method of forming a Co cap on a Cu interconnect through an ULK ILD.
Figure 1B:
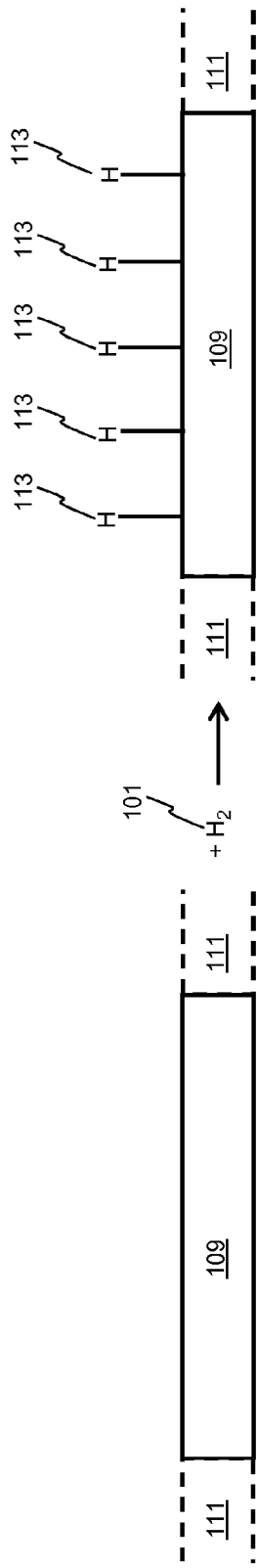
Figure 1C:
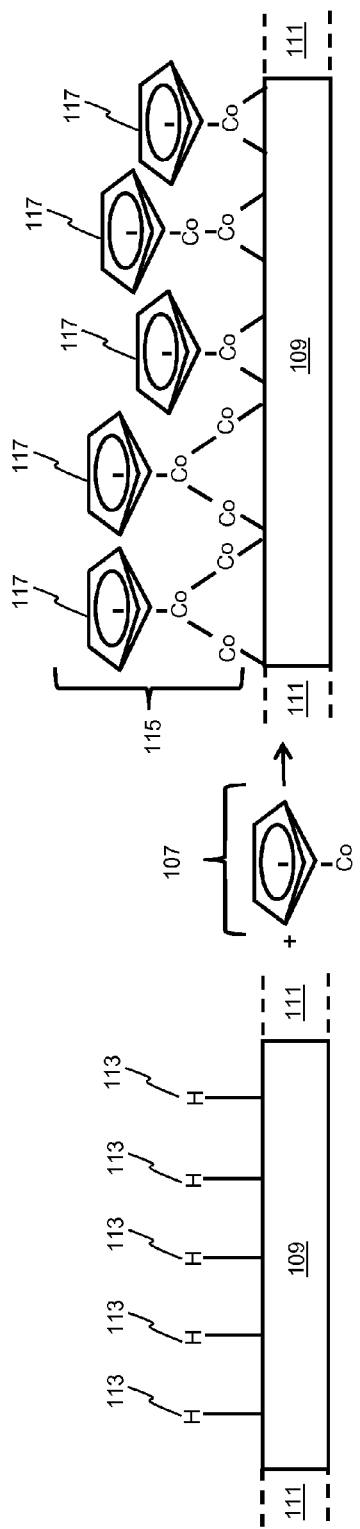

Adverting to FIG. 1A, during the vapor phase of the selective Co cap process, e.g., during chemical vapor deposition (CVD), $H_2$ 101 strips the dicarbonyl groups 103 from the Co precursor $Co(C_5H_5)(CO)_2$ 105 resulting in cobaltocene (Co $(C_5H_5)$) 107 plus $H_2$. The Cu surface of an interconnect or via 109 through the ULK ILD 111 then bonds with the hydrogen (H), becoming terminated by H 113, as depicted in FIG. 1B. Next, the cobaltocene 107 replaces each H 113, forming a Co cap 115 on the Cu 109 surface, as depicted in FIG. 1C. The Co cap 115 deposition rate is limited by the subsequent $NH_3$ plasma treatment for removing carbon ring groups 117 from the Co cap 115.

Figure 1D:
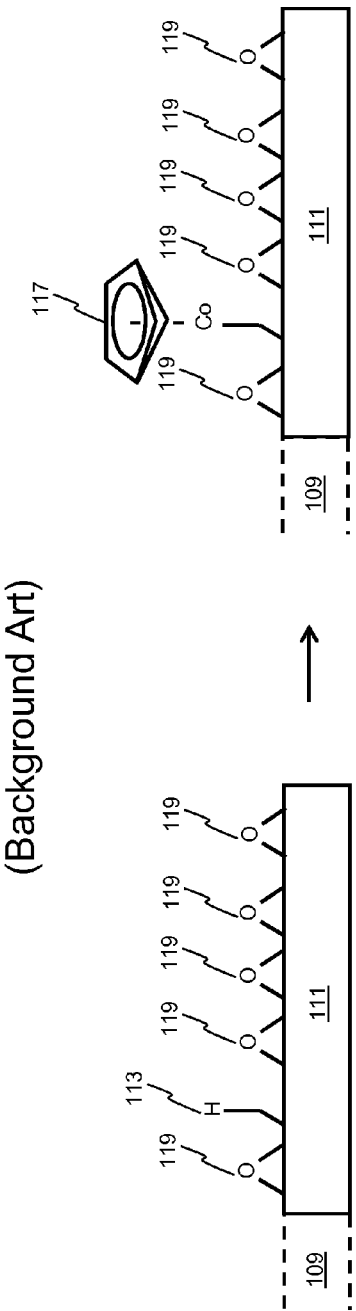
Figure 1E:
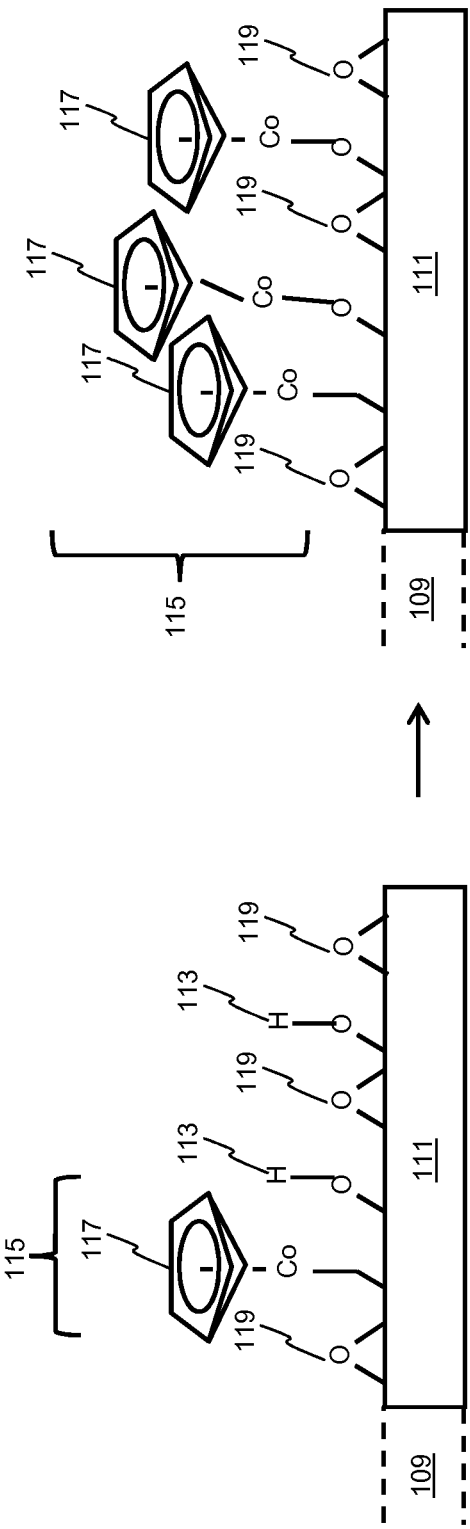

Unlike the Cu 109 surface terminated with H 113 in FIG. 1C, oxygen 119 bonds to the ULK ILD 111 surface and only a very limited amount of the ULK ILD 111 surface is terminated with H 113, as depicted in FIG. 1D (only one H 113 is depicted for illustrative convenience). Similar to FIG. 1C, the H 113 is replaced by a cobaltocene 107 (including a carbon ring 117) to form a portion of a Co cap 115 on the ULK ILD 111 surface. Next, a $NH_3$ plasma treatment is performed whereby one or more of the oxygen 119 bonds are broken and the dangling bonds become terminated by a H 113, as depicted in the left side of FIG. 1E. Thereafter, when $Co(C_5H_5)(CO)_2$ 105 and $H_2$ 101 are again deposited over the Cu 109 surface and the ULK ILD 111 surface during the two repeated cycles or loops, cobaltocene 107 (including carbon rings) replaces the H 113 and bonds to the ULK ILD 111 surface, forming additional Co cap 115. With each cycle of depositing $Co(C_5H_5)(CO)_2$ 105 and $H_2$ 101 through performing the $NH_3$ plasma treatment, e.g., a total of three (3) loops or cycles, oxygen 119 bonds on the ULK ILD 111 surface are broken and replaced by the cobaltocene 107. The continued formation of the Co cap 115 on the ULK ILD 111 surface reduces selectivity between the Cu 109 surface and the ULK ILD 111 surface, and too much Co cap 115 on the ULK ILD 111 surface will cause TDDB failure.

Figure 2A:
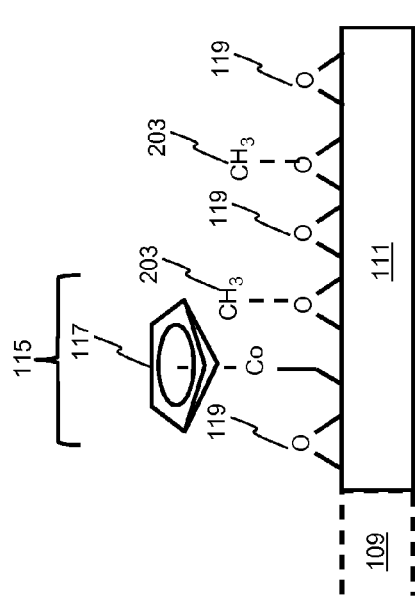
FIGS. 2A through 2B schematically illustrate sequential steps of a method of forming a Co cap on a Cu interconnect through an ULK ILD with increased selectively while protecting the ULK ILD, in accordance with an exemplary embodiment.
Figure 2A:
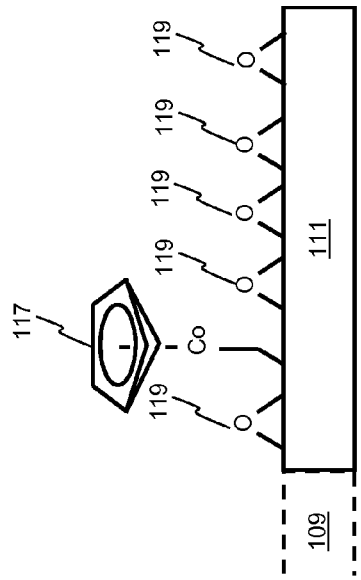
Figure 2B:
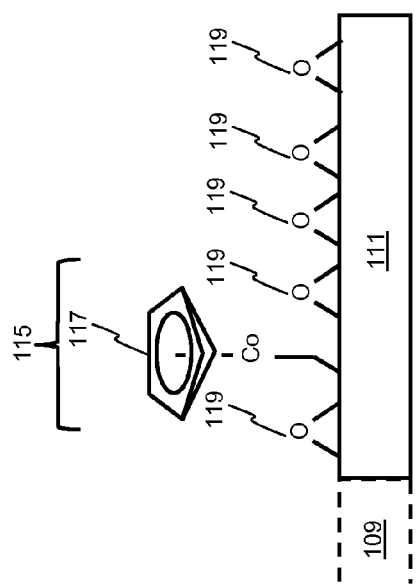
Figure 2B:
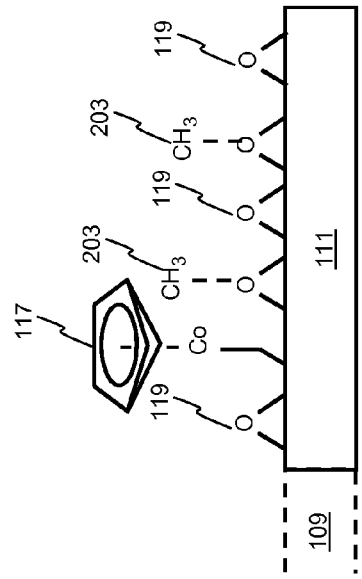

FIGS. 2A and 2B schematically illustrate a method of forming a Co cap on a Cu interconnect in an ULK ILD with increased selectivity while protecting the ULK ILD, in accordance with an exemplary embodiment. Adverting to FIG. 2A, following the steps described with respect to FIGS. 1A through 1D, a UV cured methyl, e.g., TMS or 4MS, is deposited over the Co Cap 115 and the ULK ILD 111 surface, and as depicted by the arrow 201, a methyl group ($CH_3$) 203 is formed on top of the oxygen 119 bonds. The UV cured TMS or 4MS may be deposited, for example, at 200° C. to 400° C. for 30 sec to 90 sec. The UV cured TMS or 4MS may also be deposited, e.g., at a pressure of 20 torr to 40 torr. Unlike during the $NH_3$ plasma treatment described with respect to FIG. 1E, the $CH_3$ 203 does not break any of the oxygen 119 bonds attached to the ULK ILD 111 surface. Instead, when the $NH_3$ plasma treatment is subsequently performed, as represented by the arrow 205 in FIG. 2B, the $CH_3$ 203 prevents additional Co Cap 115 from forming on the ULK ILD 111 surface. Similar to FIGS. 1A through 1E, the steps of depositing the $Co(C_5H_5)(CO)_2$ through performing the $NH_3$ plasma treatment are then repeated two more times (for a total of three loops or cycles) to further remove impurities from the Co cap 115. Consequently, a Co cap 115 can be formed on the Co 109 surface with a selectivity greater than 200 with respect to the ULK ILD 111 surface (as opposed to about 125 by conventional methods) with minimal damage to the ULK ILD 111 surface.

The embodiments of the present disclosure can achieve several technical effects including almost doubling the selectivity of the Co cap process while protecting the ULK ILD surface. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
providing a copper (Cu) filled via in an ultra low-k (ULK) interlayer dielectric (ILD);

depositing a cobalt (Co) precursor and hydrogen ($H_2$) over the Cu-filled via and the ULK ILD, the Co precursor and $H_2$ forming a Co cap over the Cu-filled via;

depositing an ultraviolet (UV) cured methyl over the Co cap and the ULK ILD;

performing an ammonia ($NH_3$) plasma treatment after depositing the UV cured methyl; and repeating the steps of depositing a Co precursor through performing an $NH_3$ plasma treatment to remove impurities from the Co cap.

2. The method according to claim 1, comprising depositing cyclopentadienylcobalt dicarbonyl ($Co(C_5H_5)(Co)_2$) as the Co precursor.

3. The method according to claim 1, comprising depositing the Co precursor by thermal chemical vapor deposition (CVD).

4. The method according to claim 1, comprising depositing trimethylsilane (TMS) as the UV cured methyl.

5. The method according to claim 1, comprising depositing tetramethylsilane (4MS) as the UV cured methyl.

6. The method according to claim 1, comprising depositing UV cured TMS or 4MS at a temperature of 200° C. to 400° C.

7. The method according to claim 6, comprising depositing the UV cured TMS or 4MS at the temperature for 30 second (sec) to 90 sec.

8. The method according to claim 6, comprising depositing the UV cured TMS or 4MS at a pressure 20 torr to 40 torr.

9. The method according to claim 1, comprising repeating the steps of depositing a Co precursor through performing an $NH_3$ plasma treatment two (2) times.

10. A method comprising:
providing a copper (Cu) filled via in an ultra low-k (ULK) interlayer dielectric (ILD);
depositing cyclopentaienylcobalt dicarbonyl ($Co(C_5H_5)(Co)_2$) and hydrogen ($H_2$) over the Cu-filled via and the ULK ILD, the $Co(C_5H_5)(Co)_2$ and $H_2$ forming a Co cap over the Cu-filled via;
depositing ultraviolet (UV) cured trimethylsilane (TMS) or tetramethylsilane (4MS) over the Co cap and the ULK ILD;
performing an ammonia ($NH_3$) plasma treatment after depositing the UV cured TMS or 4MS; and
repeating the steps of depositing $Co(C_5H_5)(Co)_2$ through performing an $NH_3$ plasma treatment to remove impurities from the Co cap.

11. The method according to claim 10, comprising depositing the $Co(C_5H_5)(Co)_2$ by thermal chemical vapor deposition (CVD).

12. The method according to claim 10, comprising depositing the UV cured TMS or 4MS at a temperature of 200° C. to 400° C.

13. The method according to claim 12, comprising depositing the UV cured TMS or 4MS at the temperature for 30 second (sec) to 90 sec.

14. The method according to claim 12, comprising depositing the UV cured TMS or 4MS at a pressure 20 torr to 40 torr.

15. The method according to claim 10, comprising repeating the depositing through performing steps two (2) times.

16. A method comprising:
providing a copper (Cu) filled via in an ultra low-k (ULK) oxide interlayer dielectric (ILD); and
forming a cobalt (Co) cap on the Cu filled via with a selectivity greater than 200 with respect to the ULK oxide ILD by:
depositing cyclopentadienylcobalt dicarbonyl (Co $(C_5H_5)(Co)_2$) and hydrogen ($H_2$) over the Cu-filled via and the ULK oxide ILD, forming a Co cap;
depositing ultraviolet (UV) cured trimethylsilane (TMS) or tetramethylsilane (4MS) over the Co cap and the ULK oxide ILD;
performing an ammonia ($NH_3$) plasma treatment after depositing the UV cured TMS or 4MS; and
repeating the depositing $Co(C_5H_5)(Co)_2$ through performing an $NH_3$ plasma treatment steps two (2) times.

17. The method according to claim 16, comprising depositing the $Co(C_5H_5)(Co)_2$ by thermal chemical vapor deposition (CVD).

18. The method according to claim 16, comprising depositing the UV cured TMS or 4MS at a temperature of 200° C. to 400° C.

19. The method according to claim 18, comprising depositing the UV cured TMS or 4MS at the temperature for 30 second (sec) to 90 sec.

20. The method according to claim 18, comprising depositing the UV cured TMS or 4MS at a pressure 20 torr to 40 torr.

* * * * *